(12) United States Patent
Takeuchi

(10) Patent No.: US 6,590,829 B2
(45) Date of Patent: Jul. 8, 2003

(54) SEMICONDUCTOR INTEGRATED CIRCUIT

(75) Inventor: Yoshiaki Takeuchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/072,992

(22) Filed: Feb. 12, 2002

(65) Prior Publication Data

US 2002/0126566 A1 Sep. 12, 2002

(30) Foreign Application Priority Data

Mar. 6, 2001 (JP) ........................................ 2001-062268

(51) Int. Cl.[7] ................................................ G11C 8/00
(52) U.S. Cl. ..................................... 365/233.5; 365/195
(58) Field of Search .............................. 365/233.5, 195

(56) References Cited

U.S. PATENT DOCUMENTS 5,313,434 A * 5/1994 Abe .......................... 365/233.5
5,903,492 A   5/1999 Takashima .................. 365/145

FOREIGN PATENT DOCUMENTS

| JP | 6-12617 | 3/1986 |
| JP | 7-70214 | 5/1988 |
| JP | 5-342881 | 12/1993 |

* cited by examiner

*Primary Examiner*—M. Tran
(74) *Attorney, Agent, or Firm*—Banner & Witcoff, Ltd.

(57) ABSTRACT

A semiconductor integrated circuit includes a first address transition detecting circuit which detects transitions of a row address signal and a column address signal of a memory cell array, a second address transition detecting circuit which detects only the transition of the column address signal, a control circuit which generates an internal circuit control signal with a desired period of time required for row access based on only a first detection signal and generates a column-related circuit control signal with a desired period of time required for column access to the memory cell array based on only a second detection signal, and a mode discriminator which determines one of the row access and the column access to be made and performs the access control operation based on the determination result.

20 Claims, 13 Drawing Sheets

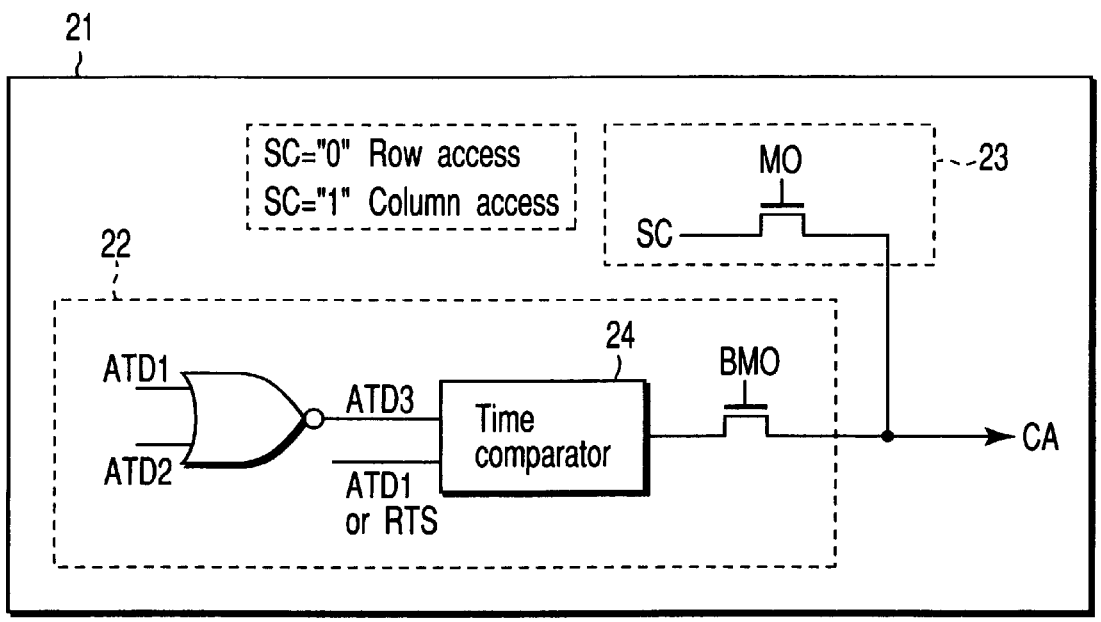
F I G. 4A
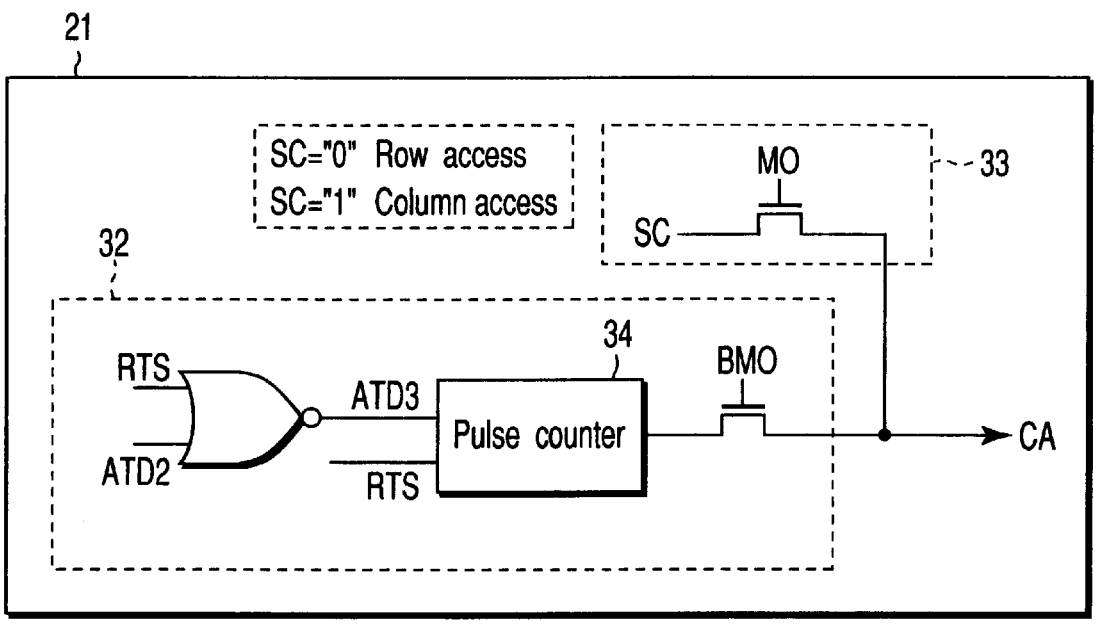
F I G. 4B

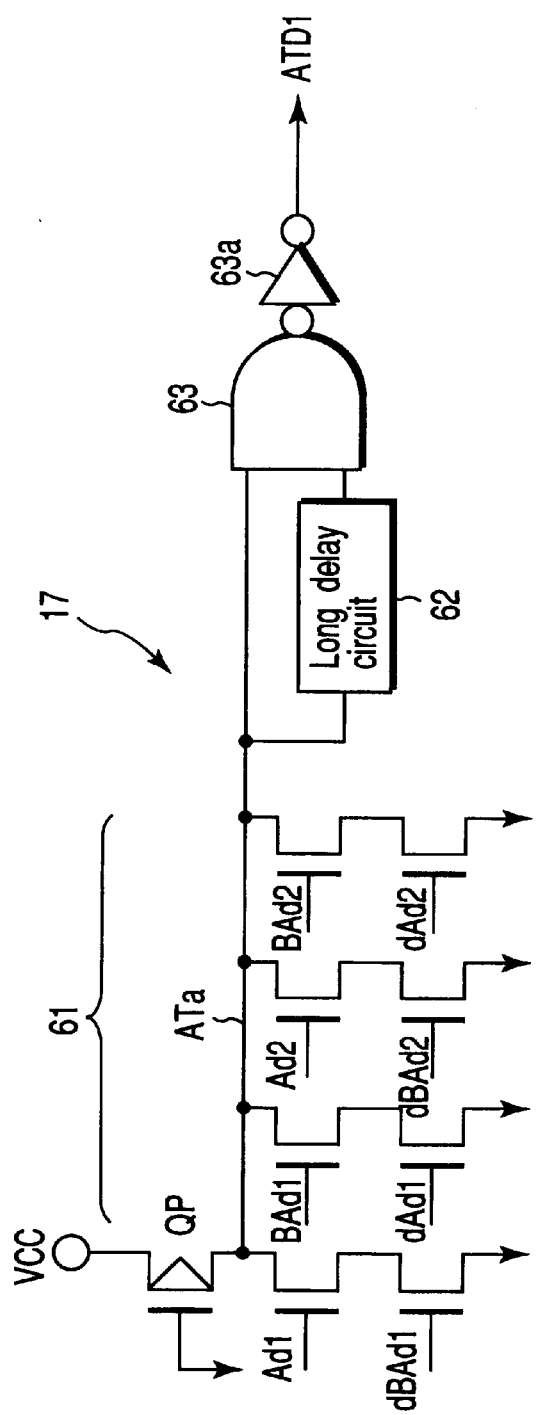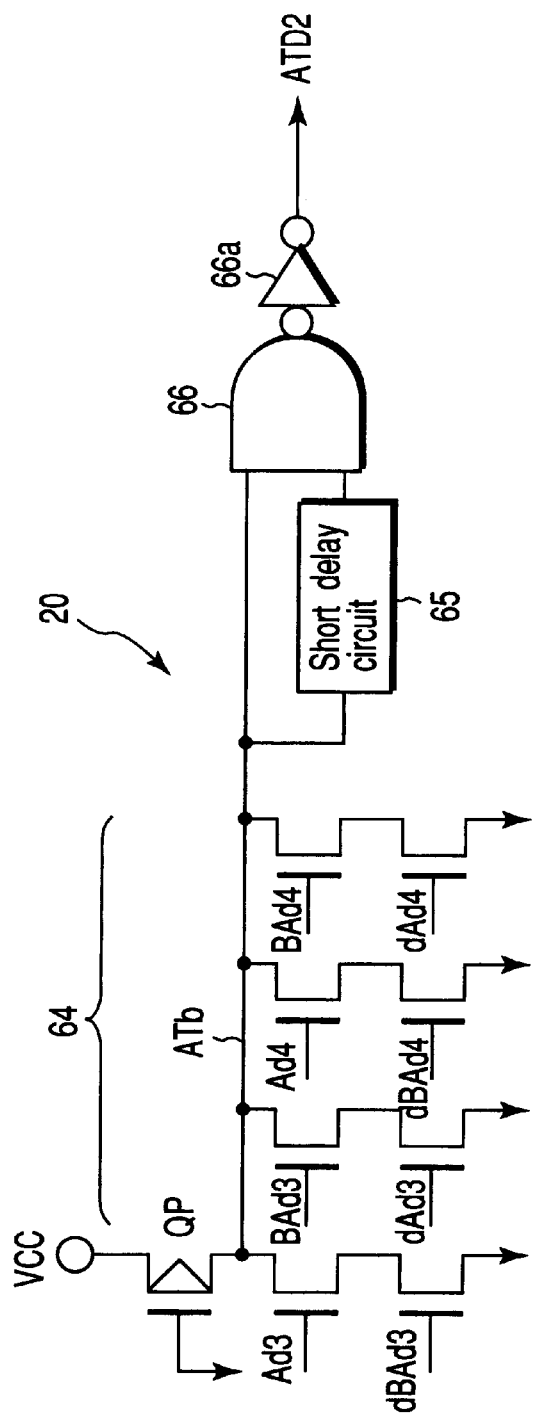
FIG. 6A
FIG. 6B

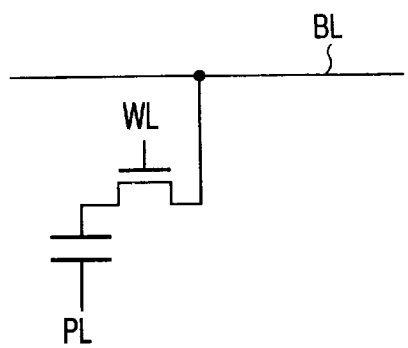
FIG. 11A
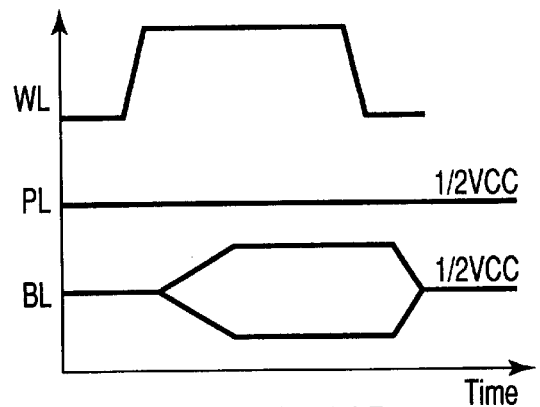
FIG. 11B
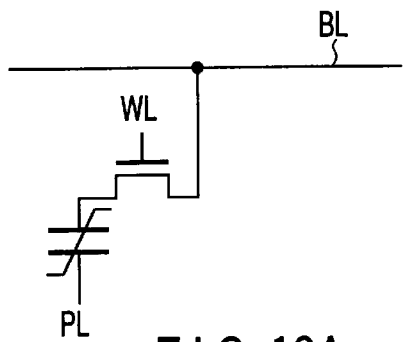
FIG. 12A
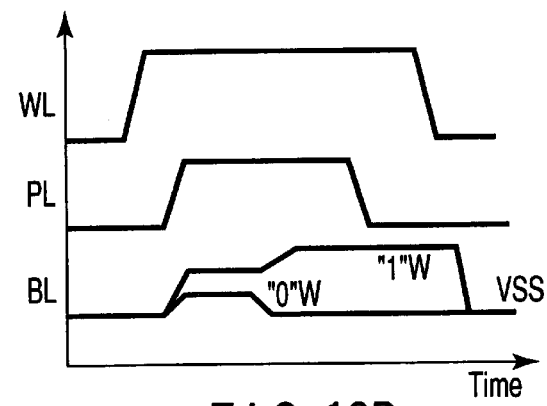
FIG. 12B
FIG. 13
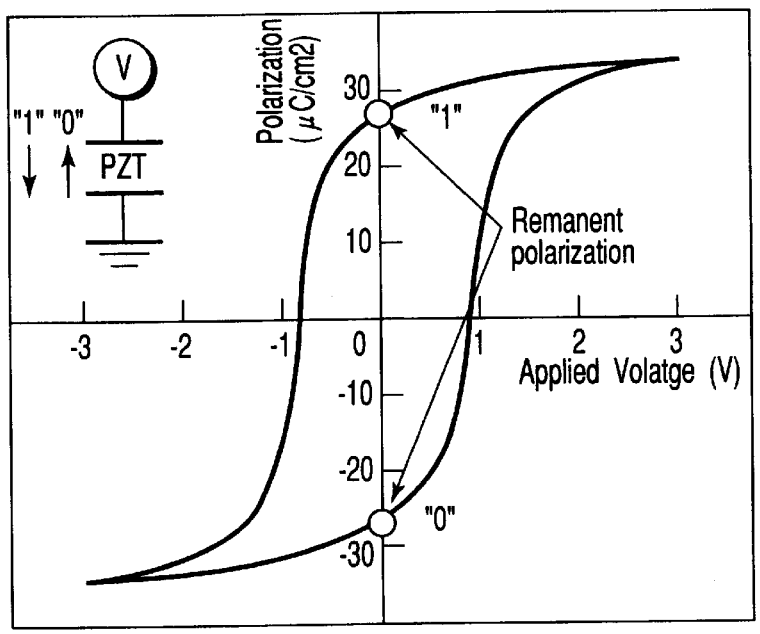

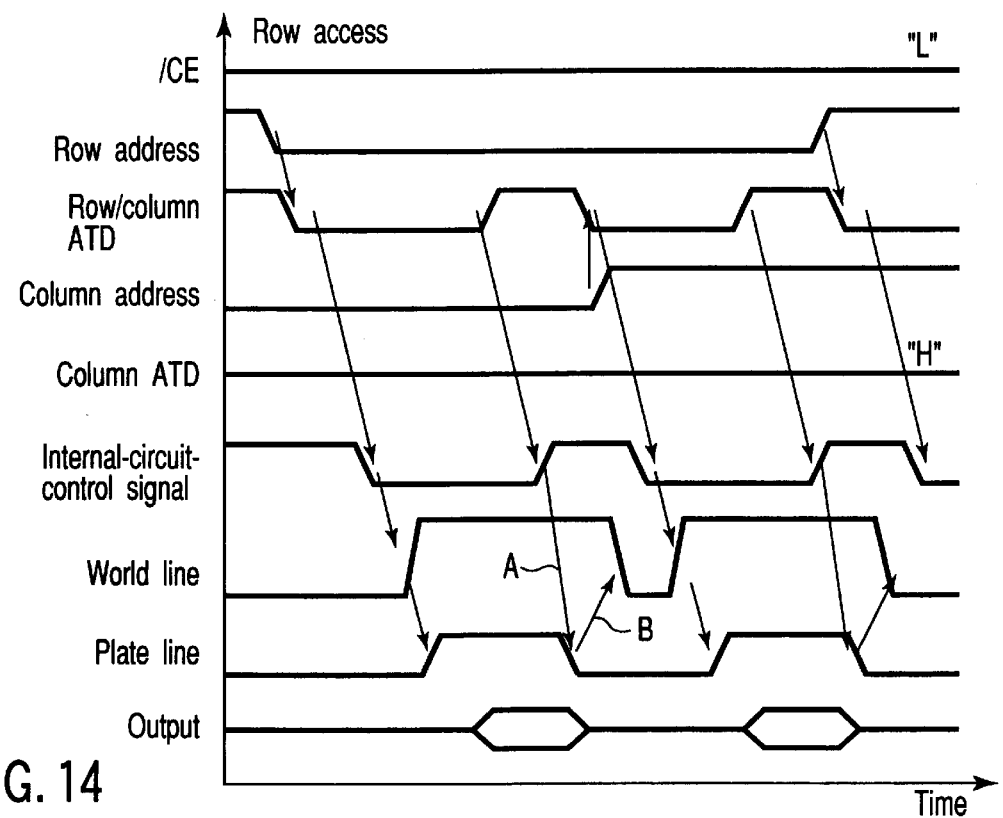
F I G. 14
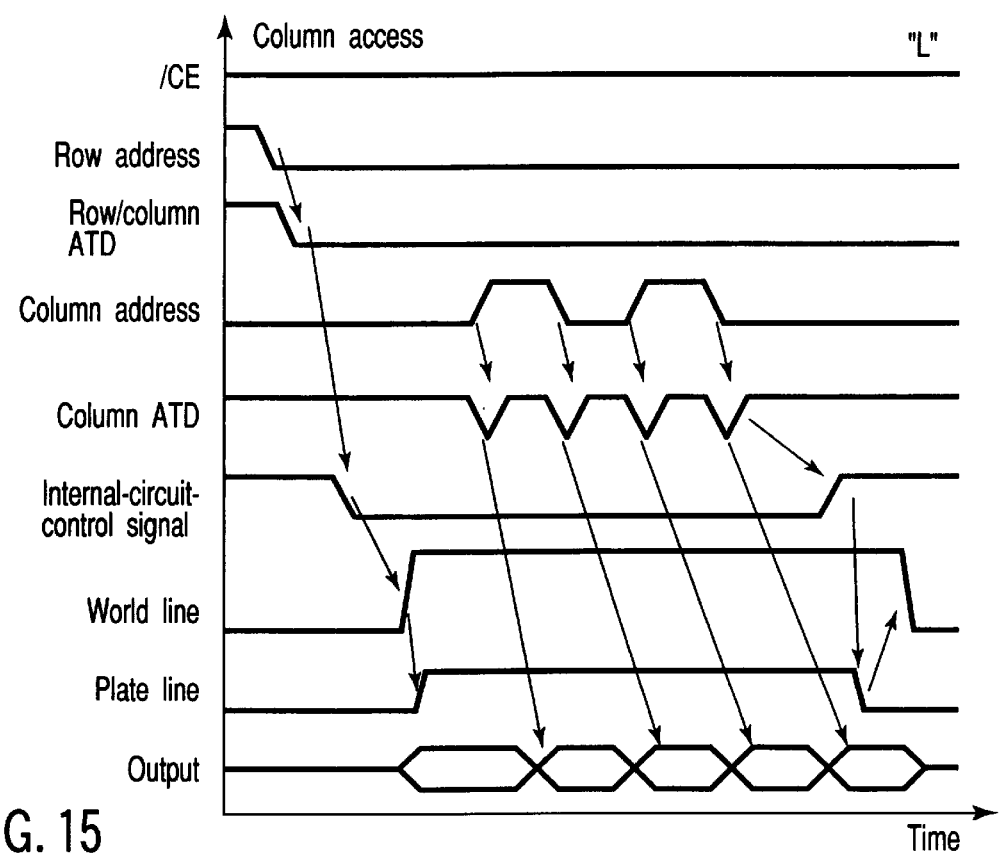
F I G. 15

SEMICONDUCTOR INTEGRATED CIRCUIT

CROSS-REFERENCE TO RELATED APPLICATIONS

This application is based upon and claims the benefit of priority from the prior Japanese Patent Application No. 2001-062268, filed Mar. 6, 2001, the entire contents of which are incorporated herein by reference.

BACKGROUND OF THE INVENTION

1. Field of the Invention

This invention relates to a semiconductor integrated circuit and more particularly to a semiconductor integrated circuit having mounted thereon a pseudo SRAM (pseudo static random access memory) using a DRAM (Dynamic Random Access Memory) or FeRAM (Ferroelectric Random Access Memory) in a memory core section.

2. Description of the Related Art

A pseudo SRAM using a DRAM or FeRAM in a memory core section is commercialized in order to enhance the integration density while keeping compatibility with the existing SRAM in the application. As the conventional pseudo SRAM, a synchronous SRAM in which the internal operation is controlled according to a clock signal internally created in a time series fashion based on an external input signal, for example, a /CE (chip enable) signal is dominantly used.

Recently, the demand for pseudo SRAMs designed for mobile telephones (cellular phones) becomes stronger and it is strongly required to develop asynchronous SRAMs which can be operated asynchronously with respect to an external input signal.

Further, if a DRAM is used in the memory core section of the pseudo SRAM, a high speed operation mode such as a static column mode in which memory cells on a row selected by a row address following a /RAS (Row Address Strobe) signal are sequentially accessed by use of a column address signal is provided in many cases.

However, the conventional pseudo SRAM has a problem that the high speed operation mode of the DRAM in the memory core section cannot be attained while the pseudo SRAM is operated asynchronously with respect to the external input signal.

Therefore, it is desired to realize a semiconductor integrated circuit in which a pseudo SRAM contained therein can be operated asynchronously with respect to the external input signal and the high speed operation mode can be asynchronously executed.

Further, it is desired to realize a semiconductor integrated circuit in which the pseudo SRAM can be selectively operated in a synchronous or asynchronous fashion with respect to the external input signal.

BRIEF SUMMARY OF THE INVENTION

A semiconductor integrated circuit according to a first aspect of this invention comprises a memory cell array, a first address transition detecting circuit which detects transition of a row address signal used to designate a row address of the memory cell array and transition of a column address signal used to designate a column address thereof, a second address transition detecting circuit which detects only the transition of the column address signal, a control circuit which generates an internal circuit control signal with a desired period of time required for row access to the memory cell array based on only a first detection signal generated from the first address transition detecting circuit to control the row access to the memory cell array based on the internal circuit control signal and generates a column-related circuit control signal with a desired period of time required for column access to the memory cell array based on only a second detection signal generated from the second address transition detecting circuit to control the column access to the memory cell array based on the column-related circuit control signal, and a mode discriminator which determines one of the row access and the column access to be made and performs the access control operation based on the determination result.

BRIEF DESCRIPTION OF THE SEVERAL VIEWS OF THE DRAWING

FIG. 4A is a block diagram showing one example of the configuration of a mode discriminator in FIG. 3;

FIG. 4B is a block diagram showing another example of the configuration of the mode discriminator in FIG. 3;

FIGS. 6A and 6B are circuit diagrams showing concrete examples of a row-and-column-related ATD and column-related ATD in FIG. 3;

FIGS. 11A and 11B are diagrams showing the equivalent circuit of a DRAM cell and an example of the operation thereof in a case where DRAM cells each having a one-transistor•one-capacitor structure are used in the memory core section in the pseudo SRAM according to the first and second embodiments;

FIGS. 12A and 12B are diagrams showing the equivalent circuit of an FeRAM cell having a one-transistor•one-capacitor structure and used in the memory core section of a pseudo SRAM according to a third embodiment and the operation waveforms thereof;

FIG. 13 is a diagram showing one example of the relation (hysteresis characteristic) between voltage applied to the cell capacitor of the FeRAM cell of FIG. 12A and remanent polarization;

FIG. 14 is a timing diagram for illustrating an example of the row access operation of a pseudo SRAM according to the third embodiment of this invention;

FIG. 15 is a timing diagram for illustrating an example of the column access operation of the pseudo SRAM according to the third embodiment.

DETAILED DESCRIPTION OF THE INVENTION

Before explaining embodiments of this invention, the circuit configuration of a pseudo SRAM which is the basis of this invention is explained.

Figure 1:
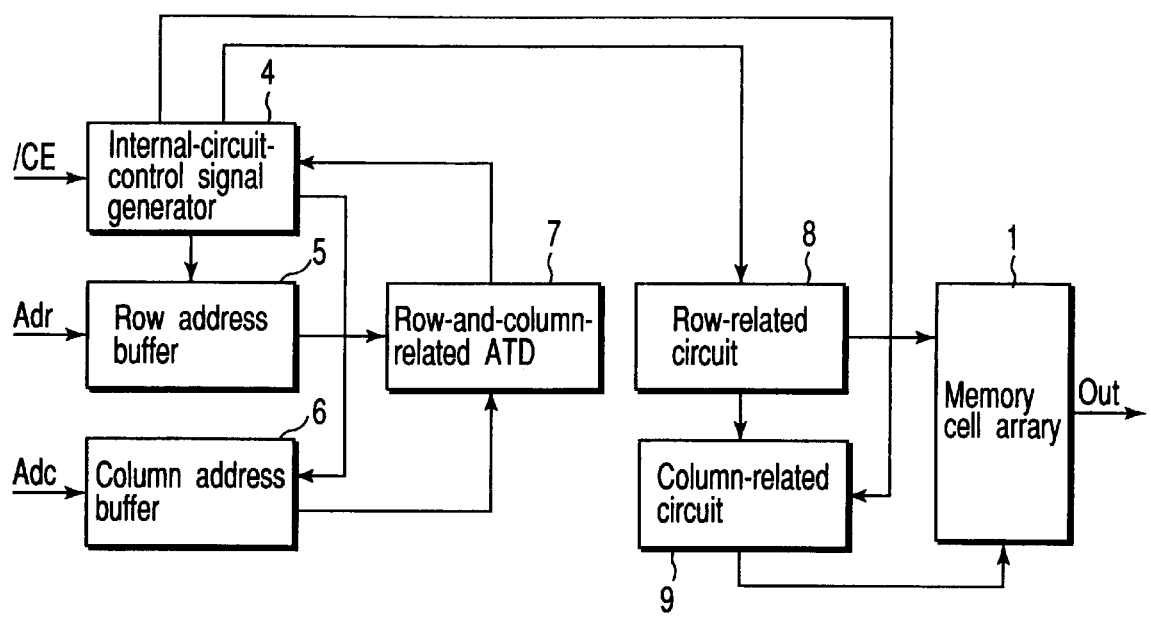
FIG. 1 is a block diagram showing the circuit configuration of a general pseudo SRAM contained in a semiconductor integrated circuit.

FIG. 1 is a block diagram showing part of a general pseudo SRAM. Reference numeral 1 denotes a memory cell array, 5 a row address buffer which is supplied with a row address signal Adr used to designate a row address of the memory cell array 1 from the exterior, 6 a column address buffer which is supplied with a column address signal Acr used to designate a column address of the memory cell array 1 from the exterior, 8 a row-related circuit, and 9 a column-related circuit.

A row-and-column-related ATD (Address Transition Detector) 7 detects transition of the row address signal and transition of the column address signal to generate an ATD signal.

An internal circuit control signal generator 4 is supplied with a /CE signal from the exterior and the ATD signal and generates an internal circuit control signal based on only the ATD signal in a state in which the /CE signal is set in the active state. The internal circuit control signal is supplied to the row address buffer 5, column address buffer 6, row-related circuit 8 and column-related circuit 9.

In this case, the internal circuit control signal generator 4 generates an internal circuit control signal with a desired period of time required for row access to the memory cell array 1 and controls the row access and column access with respect to the memory cell array 1 based on the internal circuit control signal.

The ATD provided in the conventional DRAM in order to attain a high speed mode such as a static column mode detects only transition of a column address and outputs an ATD pulse signal with short time width (for example, approximately 5 ns) which permits high speed access to a column.

On the other hand, the row-and-column-related ATD 7 of the pseudo SRAM detects not only transition of a column address signal but also transition of a row address signal and outputs an ATD signal with a long time width (for example, approximately 100 ns) required for row access.

As described above, the reason why time required for row access is long is that it is accompanied by a series of a large number of operations as follows. That is, for example, the readout operation in the row system of the memory is performed by latching a row address, selecting a word line based on the address, and reading out data of the memory cell to a bit line. Then, a small amount of potential occurring on the bit line is amplified by a sense amplifier and the potential of the bit line is set to a preset potential.

Figure 2:
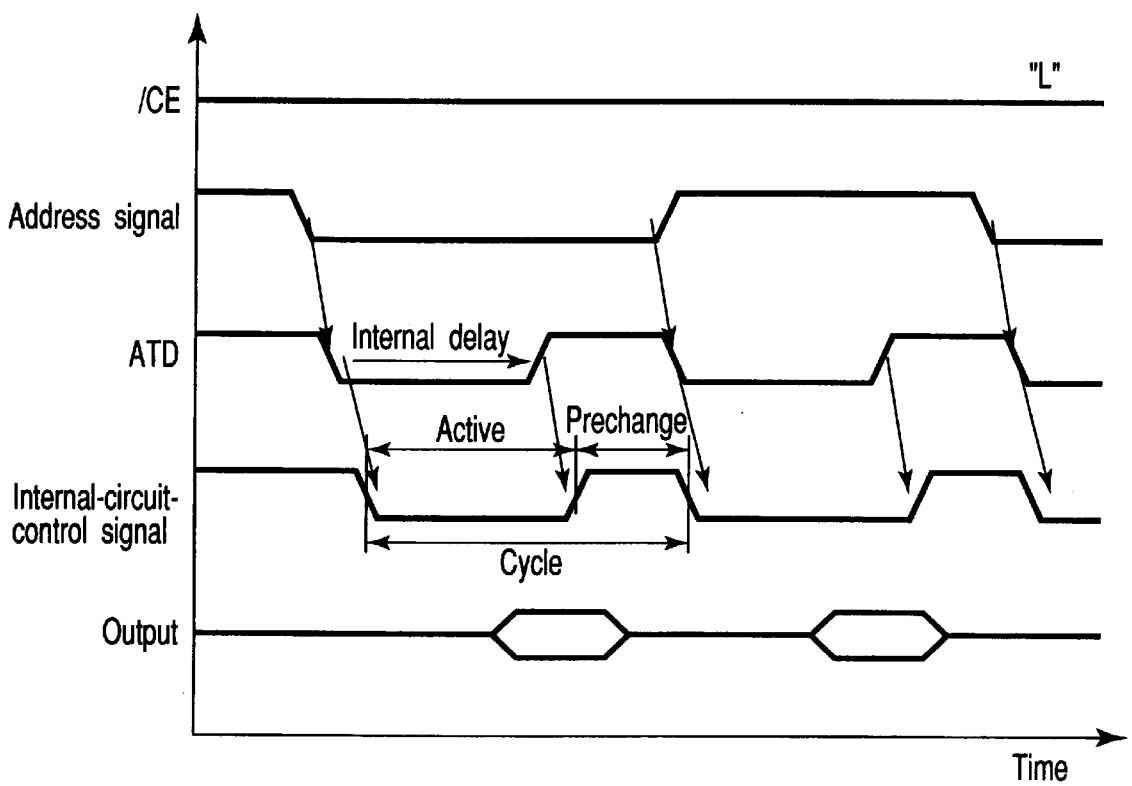
FIG. 2 is a timing diagram for illustrating an example of the operation of the pseudo SRAM shown in FIG. 1.

FIG. 2 is a timing diagram for illustrating an example of the operation of the pseudo SRAM shown in FIG. 1. An ATD signal is generated if a row address signal or column address signal transits in a state in which the /CE signal is set at the active level "L". Then, an internal circuit control signal is created based on the ATD signal, the row-related circuit 8 and column-related circuit 9 are controlled based on the above control signal, and the readout/write operation of the pseudo SRAM is performed. In this case, the active period of the internal circuit control signal corresponds to the active operation period of the pseudo SRAM and the inactive period of the internal circuit control signal corresponds to the precharge period of the pseudo SRAM. Therefore, according to the pseudo SRAM, the asynchronous operation which can be controlled based on only transition of the address signal can be realized without using a sync signal from the exterior.

However, the row-related circuit and column-related circuit of the memory have different roles and times required for the respective operations are different. That is, as described before, the row-related circuit performs a series of operations by latching a row address, selecting a word line based on the row address to read out data of the memory cell onto a bit line, amplifying a small amount of potential occurring on the bit line by use of a sense amplifier, and setting the potential on the bit line to a preset potential and the operation time is long.

On the other hand, the column-related circuit performs a series of operations by latching a column address, selecting a column select line based on the column address to output bit line potential onto a data line (DQ line), amplifying the DQ line potential by use of a sense amplifier, setting the potential of a read/write line (RW line) to a preset potential and outputting data from an output buffer and time required for the operations is relatively short.

However, in the above pseudo SRAM, the operation of the row-related circuit 8 or column-related circuit 9 is selectively controlled based on the ATD signal of one row-and-column-related ATD 7 respectively with respect to transition of the row address signal or transition of the column address signal. That is, since it is necessary to set generation timing of the ATD signal according to the performance of the row-related circuit whose operation speed is lower than that of the column-related circuit which can be operated at a high speed, the operation time of the column-related circuit becomes partly useless and it is impossible to cope with the high speed access operation of the column.

The embodiments of this invention in which the above problem is solved and the row-and-column-related ATD for row-and-column access and the column-related ATD for column access are separated and which can cope with the high speed access operation of the column are explained below.

First Embodiment

Figure 3:
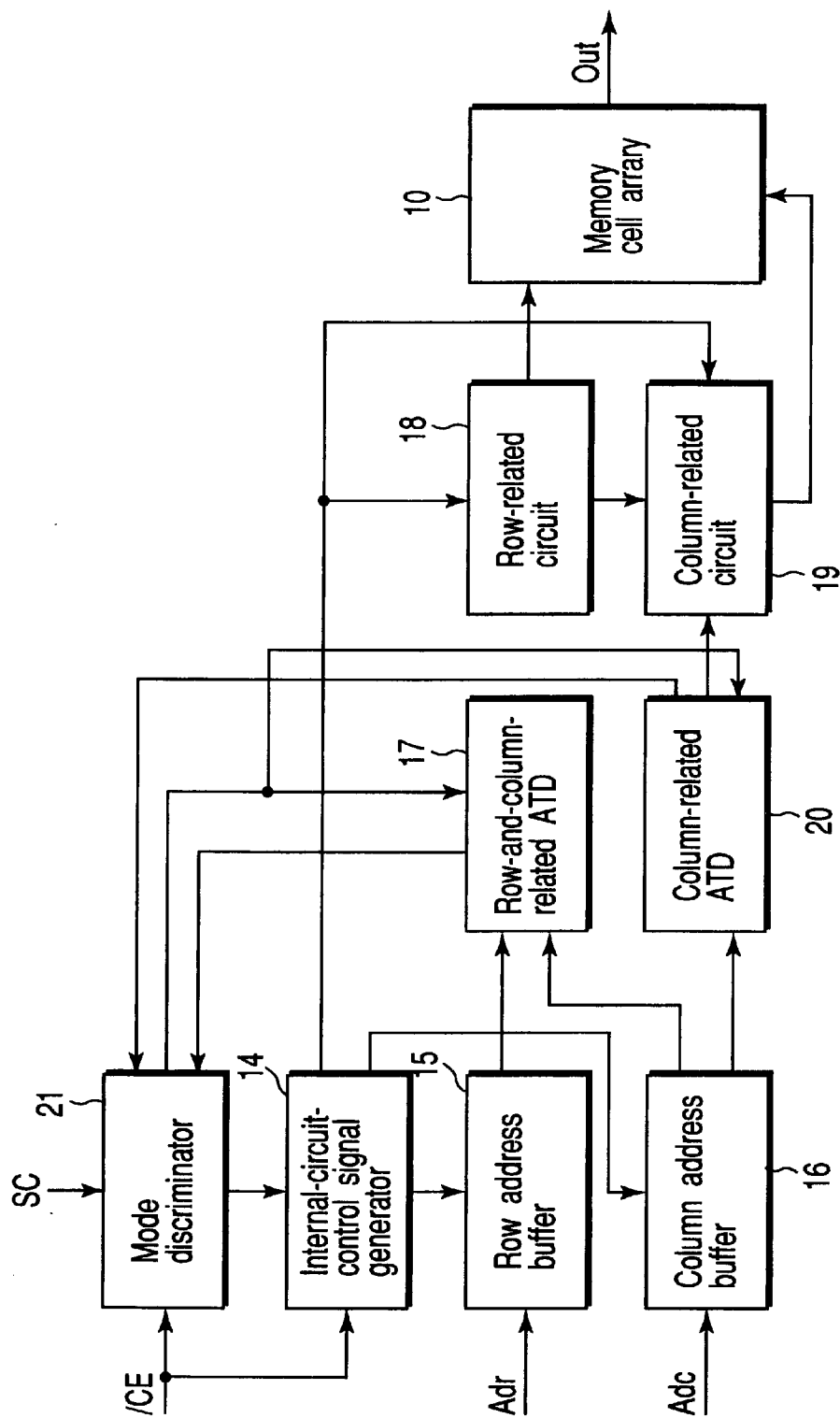
FIG. 3 is a block diagram showing the circuit configuration of a pseudo SRAM according to a first embodiment of this invention.

FIG. 3 is a block diagram showing part of a pseudo SRAM according to a first embodiment of this invention. In FIG. 3, reference numeral 10 denotes a memory cell array, 14 an internal circuit control signal generator, 15 a row address buffer, 16 a column address buffer, 17 a row-and-column-related ATD, 18 a row-related circuit, 19 a column-related circuit, 20 a column-related ATD and 21 a mode discriminator.

The above pseudo SRAM is similar to the pseudo SRAM shown in FIG. 1 except that (1) the column-related ATD 20 which detects transition of the column address signal and generates an ATD signal with a short period of time required for performing the operation of the column-related circuit 19 is additionally provided, (2) the internal circuit control signal generator 14 obtained by modifying the configuration of the internal circuit control signal generator 4 is used, and (3) the mode discriminator 21 which determines one of the row access and column access to be preferentially dealt with is additionally provided in order to cope with a completely asynchronous operation.

The reason why mode determination of the row access and column access of the pseudo SRAM by use of the mode discriminator 21 is required is explained below.

The row access and column access operations in the circuit of FIG. 3 are the same as those of the circuit of FIG. 1 up to selection of the word line, but the operation to be performed after this is different. That is, it is necessary to automatically set the standby mode (precharge cycle) when a preset time (internal delay time) has elapsed after the internal circuit control signal was generated based on the row-and-column-related ATD signal in the case of row access and prevent the standby mode from being set during the access period, automatically detect the end of access and then set the standby mode in the case of column access.

In order to meet the above requirement, the internal circuit control signal generator 14 is supplied with not only the /CE signal input from the exterior and a sensing output (first ATD signal) from the row-and-column-related ATD 17, but also a sensing output (second ATD signal) from the column-related ATD 20 and generates an internal circuit control signal based on only the ATD signal in a state in which the /CE signal is set in the active state.

In this case, an internal circuit control signal having a short period of time required for column access or an internal circuit control signal having a long period of time required for row access to the memory cell array 10 is generated according to the mode determination result and row access or column access to the memory cell array 10 is controlled based on the internal circuit control signal.

One example of the mode discriminator 21 is configured to receive a first ATD signal of the row-and-column-related circuit and a second ATD signal of the column-related circuit, automatically detect information indicating one of the row address signal and column address signal to which the address signal transited in the internal circuit of the pseudo SRAM corresponds and time between two successive address transitions and determine a priority mode based on the detection result.

Another example of the mode discriminator 21 can be configured to include a circuit which detects a mode command input from the exterior and determine a priority mode when a command which specifies one of the row access mode and column access mode to be preferentially dealt with is input from the exterior by the user before the operation of the pseudo SRAM is started or during the operation thereof.

Figure 5A:
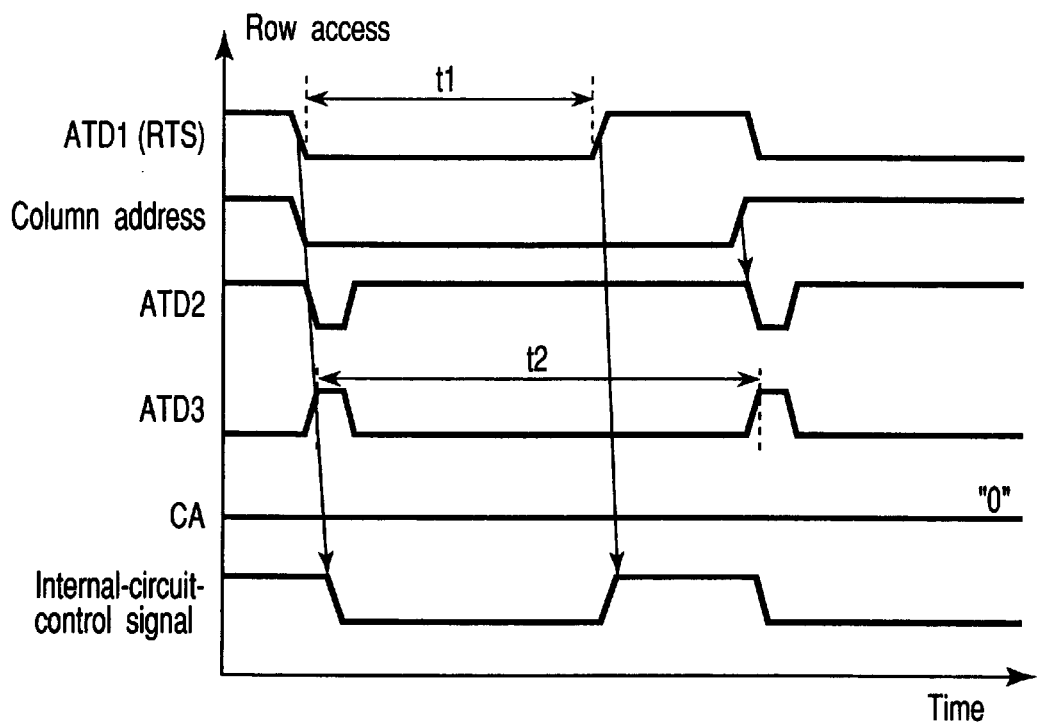
FIG. 5A is a timing diagram for illustrating an example of the operation of the mode discriminator in FIG. 4A at the time of row access.
Figure 5B:
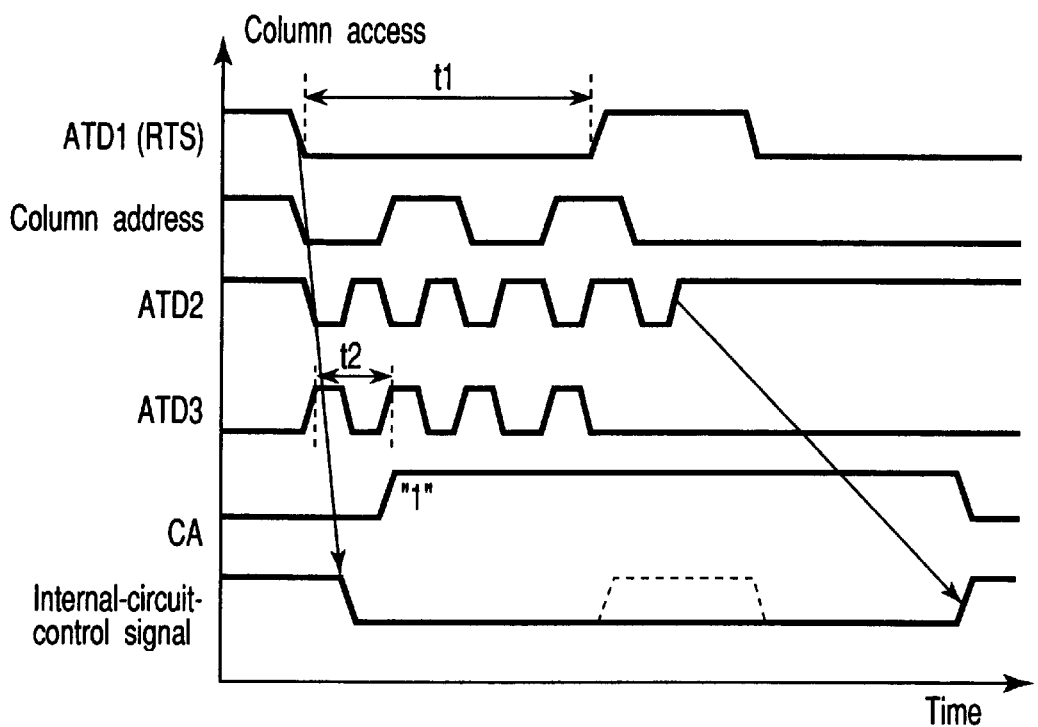
FIG. 5B is a timing diagram for illustrating an example of the operation of the mode discriminator in FIG. 4A at the time of column access.

FIG. 4A shows part of the mode discriminator 21 in FIG. 3. FIGS. 5A and 5B are timing diagrams showing examples of the operation of the mode discriminator 21 in FIG. 3.

The mode discriminator 21 is configured by a circuit 22 which automatically determines the mode by itself and a circuit 23 which determines the mode according to a mode command input from the exterior.

For example, the circuit 22 which automatically determines the mode includes a time comparator 24 in order to automatically detect a time period between address transitions and compare the detected time period with a reference time period. The reference time t1 can be obtained by providing a circuit (not shown) which creates the reference time t1 (for example, a circuit including a delay line having delay time which is approximately equal to the cycle time) in the time comparator or using the pulse width of the first ATD signal as the reference time t1.

In FIG. 4A, a first ATD signal ATD1 and a second ATD signal ATD2 are input to a NOR gate and the pulse interval (a time period between address transitions) t2 of a third ATD signal ATD3 which is an output signal of the NOR gate is compared with the reference time t1.

If the comparison result indicates that the time t2 is shorter than the reference time t1, it is determined that a mode in which column access is made is set and a CA signal is set to "1". In other cases, it is determined that a mode in which row access is made is set and the CA signal is set to "0".

If a column access mode is determined, the internal circuit control signal is kept in the active state until the end of the access operation. The internal circuit control signal generator is so configured as to determine the end of access and be set into the standby mode if the address transition interval is longer than preset time.

Figure 5C:
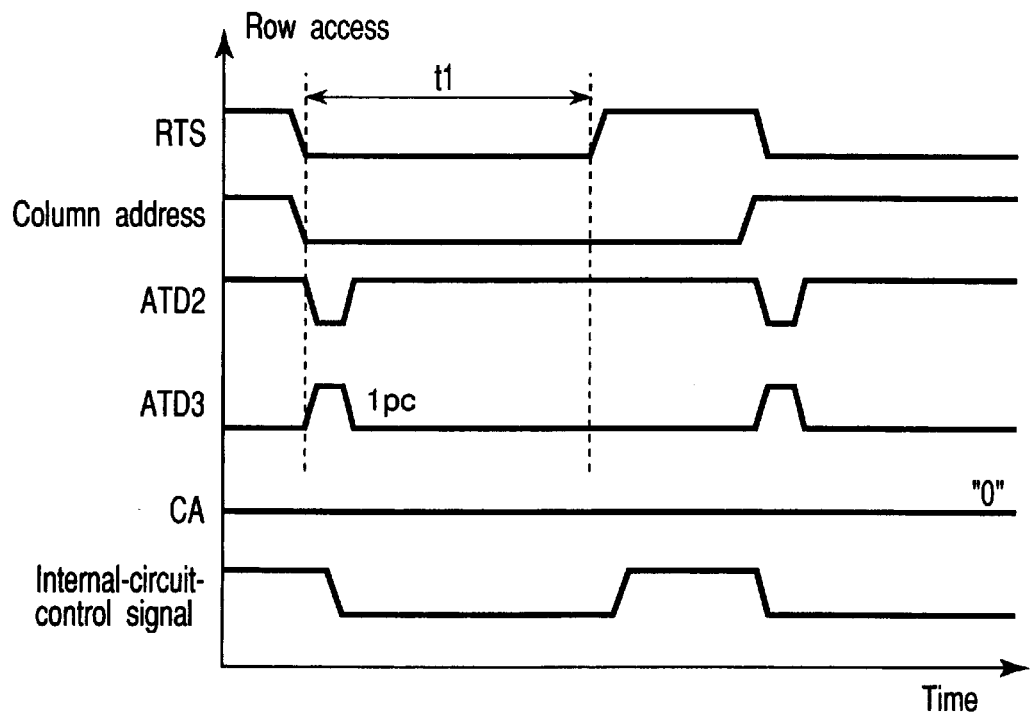
FIG. 5C is a timing diagram for illustrating an example of the operation of the mode discriminator in FIG. 4B at the time of row access.
Figure 5D:
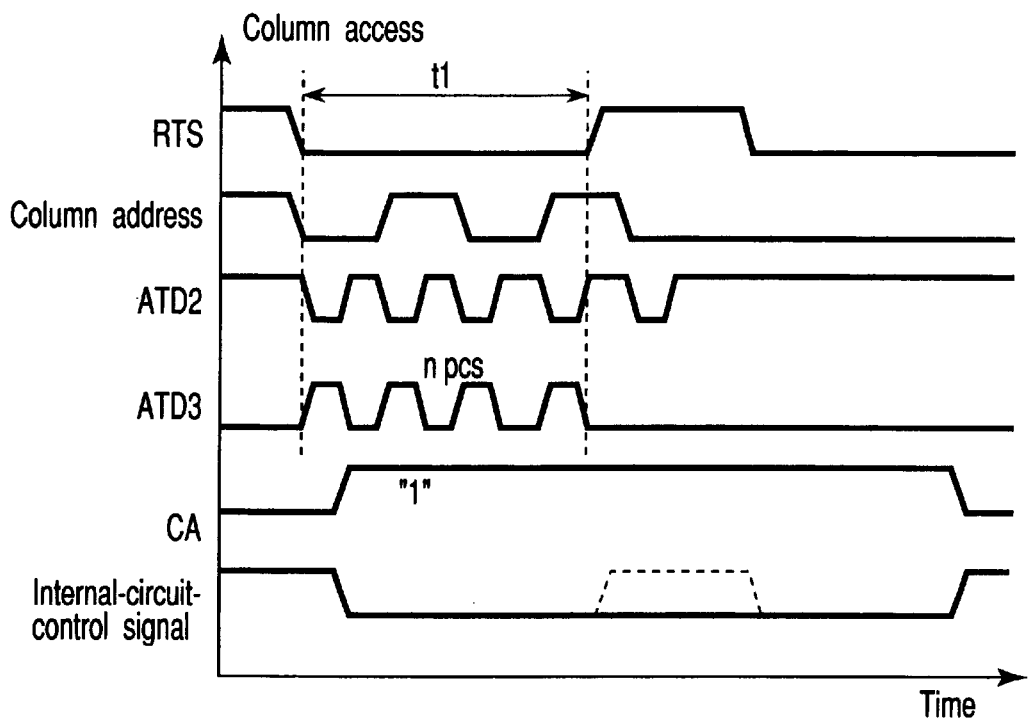
FIG. 5D is a timing diagram for illustrating an example of the operation of the mode discriminator in FIG. 4B at the time of column access.

Further, as shown in FIG. 4B, the mode discriminator 21 may be configured to include a pulse counter 34 and determine a mode in which column access is made if two or more pulses of the third ATD signal ATD3 are generated in a preset period of time and determine a mode in which row access is made in other cases. FIGS. 5C and 5D are timing diagrams for illustrating examples of the operation of the mode discriminator in FIG. 4B.

In FIG. 4B, a reference time signal RTS and a second ATD signal ATD2 are input to a NOR gate and a third ATD signal ATD3 which is an output signal of the NOR gate is input to the pulse counter 34. The pulse counter 34 is supplied with the reference time signal RTS and counts the pulse number of the third ATD signal in the reference time t1.

If the count number is "1", a mode in which row access is made is determined and the CA signal is set to "0" (FIG. 5C). If the count number is "n" ($n \geq 2$), a mode in which column access is made is determined and the CA signal is set to "1" (FIG. 5D).

The circuit 23 of FIG. 4A which determines the mode according to a mode command input from the exterior can detect the mode command input from the exterior and is so configured as to determine row access when a mode selection signal SC input via a specified address terminal or mode signal terminal previously provided is "0", for example, determine column access when the signal is "1", and set the signal CA to "0" or "1" according to the determination result.

When the column access is selected, commands are input respectively at the times of start and end of the column access. The reason for this is already described before, but is more specifically explained below. That is, the same operation as in the conventional case is performed in either case of row access or column access until a word line is selected, but in the case of row access, the standby mode is automatically set when a preset time (internal delay time) has elapsed after the internal circuit control signal was generated based on the row-and-column-related ATD signal. However, in the case of column access, it is necessary to prevent the standby mode from being set during the access period, automatically detect the end of access and then set the standby mode.

Further, as the mode discriminator, a circuit can be configured so that a system which automatically detects a time period between address transitions or a system which detects a mode command input from the exterior can be previously selectively set for each chip.

FIGS. 6A and 6B respectively show concrete examples of the row-and-column-related ATD 17 and column-related ATD 20 in FIG. 3.

Figure 7A:
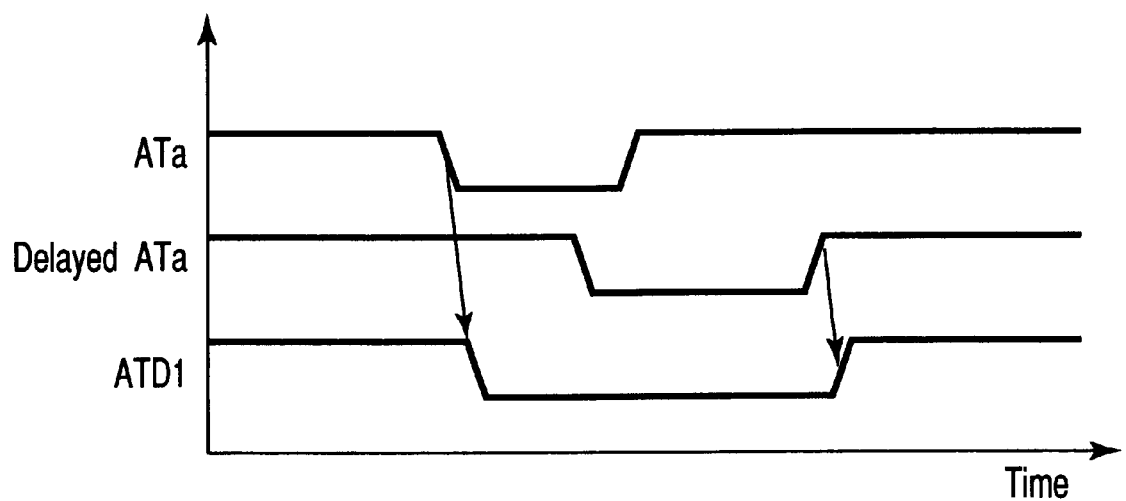
FIGS. 7A and 7B are timing diagrams for illustrating examples of the operations of the row-and-column-related ATD and column-related ATD shown in FIGS. 6A and 6B.
Figure 7B:
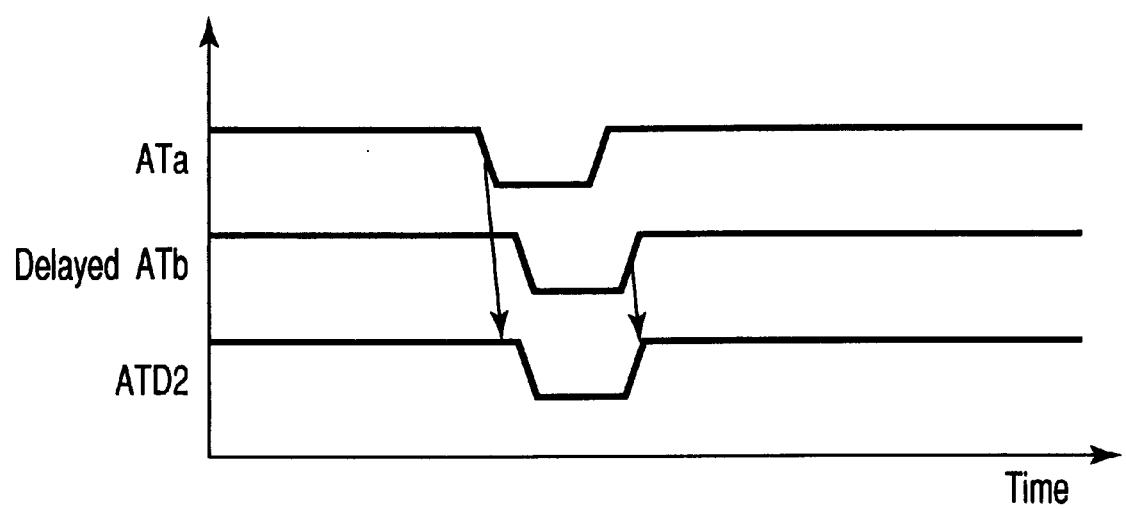

FIGS. 7A and 7B are timing diagrams respectively showing examples of the operations of the row-and-column-related ATD of FIG. 6A and the column-related ATD of FIG. 6B.

The row-and-column-related ATD shown in FIG. 6A includes a first NOR gate section 61, a first delay circuit 62 which delays an output signal of the first NOR gate section by a relatively long period of time, a first NAND gate 63 which is supplied with an output signal of the first delay circuit 62 and an output signal of the first NOR gate section 61 and an inverter circuit 63a.

The first NOR gate section 61 includes a PMOS transistor QP whose source is connected to a power supply potential (VCC) node and whose gate is connected to a ground potential (VSS) node and which is set in the normally ON state, and four sets of gate circuits which are connected in parallel between the drain (node ATa) of the PMOS transistor QP and the VSS node. Each of the four sets of gate circuits includes two NMOS transistors which are serially connected and the four sets of gate circuits are respectively supplied with pairs of output signals Ad1, BAd1, Ad2, BAd2 of an address buffer circuit (not shown) and delay signals dad1, dBAd1, dAd2, dBAd2 obtained by inverting and delaying the above output signals.

The node ATa of the first NOR gate section 61 is charged to "H" by means of the PMOS transistor QP which is normally set in the ON state, but if the address input transits, one of the four sets of gate circuits each configured by serially connecting two NMOS transistors is set in the ON state for a certain period of time and the node ATa is set at "L" during the above period of time. That is, a pulse signal is generated as shown in FIG. 7A.

The pulse signal is wave-shaped by the first delay circuit 62, first NAND gate 63 and inverter circuit 63a so as to have desired pulse width and a row-and-column-related ATD signal ATD1 is generated (refer to FIG. 7A).

The column-related ATD 20 shown in FIG. 6B includes a second NOR gate section 64, a second delay circuit 65 which delays an output signal of the second NOR gate section 64 by a relatively short period of time, a second NAND gate 66 which is supplied with an output signal of the second delay circuit 65 and an output signal of the second NOR gate section 64 and an inverter circuit 66a.

The second NOR gate section 64 includes a PMOS transistor QP whose source is connected to the VCC node and whose gate is connected to the VSS node and which is set in the normally ON state, and four sets of gate circuits which are connected in parallel between the drain (node ATb) of the PMOS transistor QP and the VSS node. Each of the four sets of gate circuits includes two NMOS transistors which are serially connected and the four sets of gate circuits are respectively supplied with pairs of output signals Ad3, BAd3, Ad3, BAd4 of an address buffer circuit (not shown) and delay signals dAd3, dBAd3, dAd4, dBAd4 obtained by inverting and delaying the above output signals.

The node ATb of the second NOR gate section 64 is charged to "H" by means of the PMOS transistor QP which is normally set in the ON state, but if the address input transits, one of the four sets of gate circuits each configured by serially connecting two NMOS transistors is set in the ON state for a certain period of time and the node ATb is set at "L" during the above period of time (a pulse signal is generated).

The pulse signal is wave-shaped by the second delay circuit 65, second NAND gate 66 and inverter circuit 66a so as to have a desired pulse width and thus a column-related ATD signal ATD2 is generated (refer to FIG. 7B).

The configurations of the row-and-column-related ATD 17 and column-related ATD 20 are not limited to the examples of the configurations shown in FIGS. 6A and 6B and they can be variously modified if they can detect address transition and generate a pulse for a certain period of time.

Figure 8A:
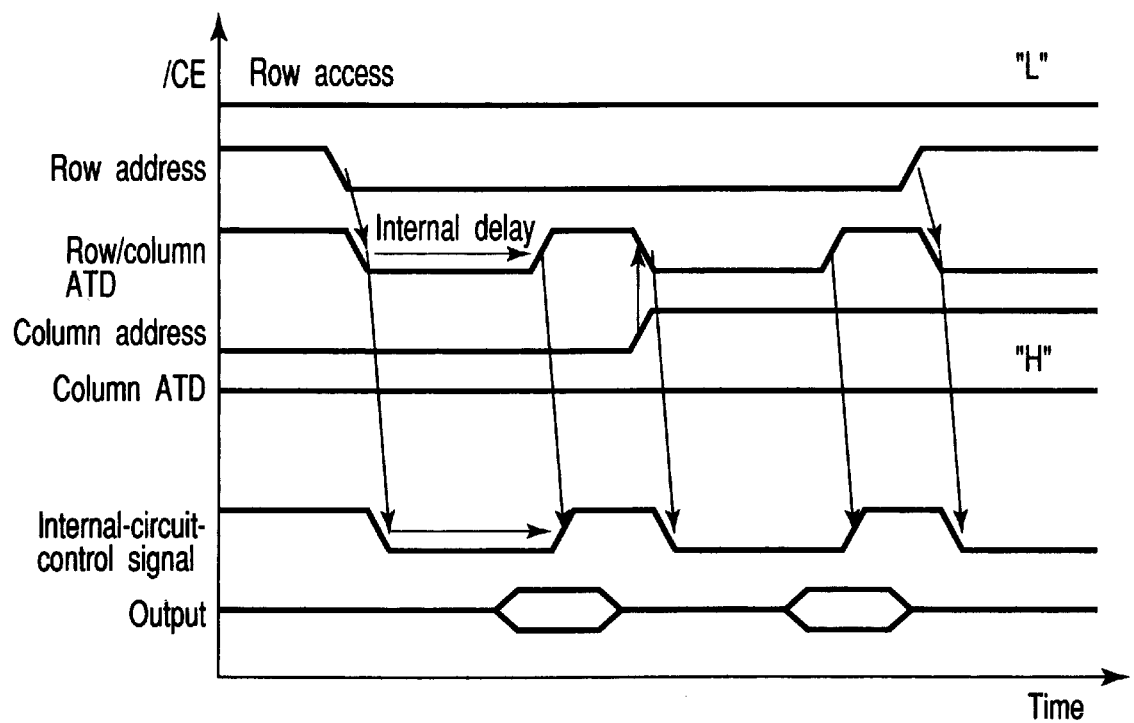
FIGS. 8A and 8B are timing diagrams for illustrating examples of the row access and column access operations of the pseudo SRAM in FIG. 3.
Figure 8B:
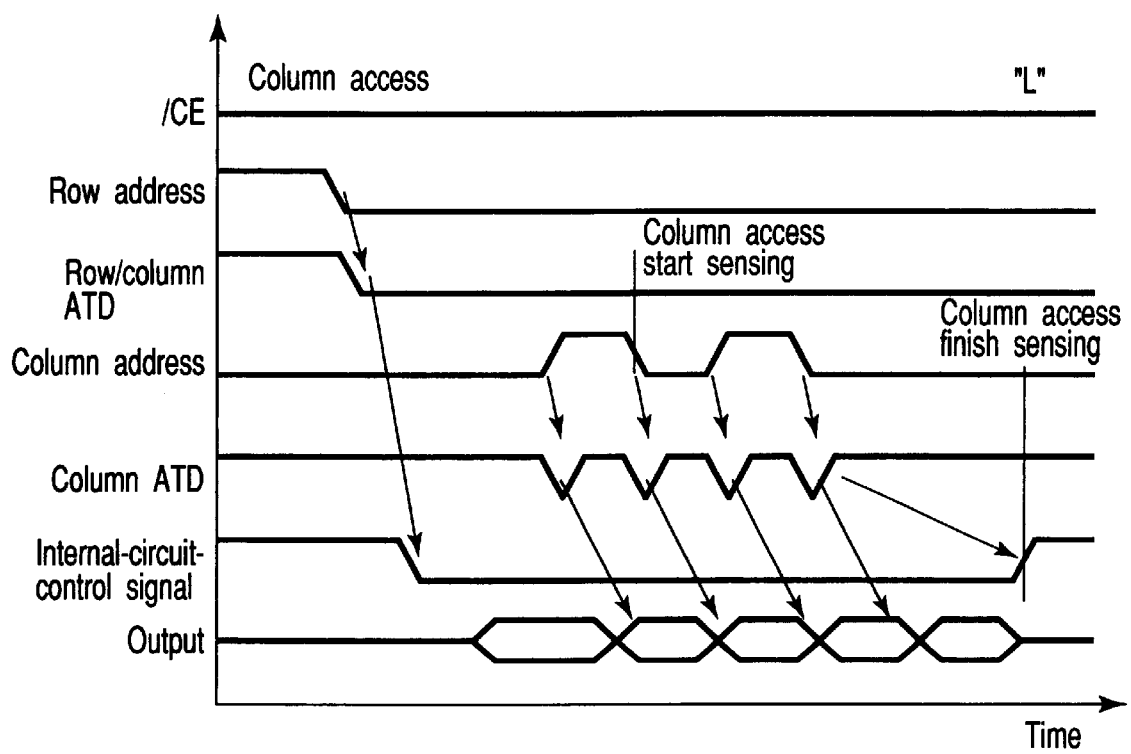

FIG. 8A is a timing diagram for illustrating an example of the row access operation of the pseudo SRAM of FIG. 3 and FIG. 8B is a timing diagram for illustrating an example of the column access operation of the pseudo SRAM of FIG. 3.

At the time of row access shown in FIG. 8A, the transition of a row address is detected by use of the row-and-column-related ATD 17 while the /CE signal is maintained at the active level "L" and, as a result, a row-and-column-related ATD signal is activated ("L"). An internal circuit control signal is generated based on the row-and-column-related ATD signal and the row-related circuit 18 and column-related circuit 19 are controlled in synchronism with the control signal.

In this case, since a time period from the row address transition to the next address transition is long (longer than the cycle time), row access is determined by automatic detection of the mode discriminator 21 and the operation of one cycle is performed in the cycle time (for example, 100 ns). At this time, it is preferable to preferentially deal with the operation only by the row-and-column-related ATD 17 so as to perform the internal operation (which is the same operation as in the first embodiment) in synchronism with the internal circuit control signal, interrupt the operation of the column-related ATD 20 and prevent the useless operation from being performed.

As described above, since the internal circuit control signal is generated based on the row-and-column-related ATD signal and the row-related circuit 18 and column-related circuit 19 are controlled in synchronism with the control signal, the asynchronous operation which can be controlled only by use of address transition can be realized without using a sync signal from the exterior.

At the time of column access shown in FIG. 8B, the transition of a row address is detected by use of the row-and-column-related ATD 17 while the /CE signal is kept at the active level "L", and after the row-and-column-related ATD signal is activated ("L"), the column-related ATD signal is activated ("L") in response to the next address transition (column address transition). In this case, since a time period from the row address transition to the next address transition is short (shorter than the cycle time), column access is determined by automatic detection of the mode discriminator 21 and the column access operation is performed. As a result, the column-related circuit 19 is controlled according to a short column-related ATD signal so that the operation for reading out data at high speed can be performed like the case of the conventional static column mode. At this time, it is preferable to preferentially deal with the operation of the column-related ATD 20, interrupt the operation of the row-and-column-related ATD 17 and prevent the useless operation from being performed.

If the mode discriminator 21 detects that the interval between the column address transition and the next address transition becomes longer than a preset time, the end of column access is determined and the standby mode is set. At this time, the internal control signal is controlled to be kept at "L" (active state) until the end of the column access.

At the time of first access after the power supply is turned ON, the mode discriminator 21 is so configured as to determine that the access is row access. The reason is that column access cannot be made until a word line is selected. Further, it is necessary to start column access before the internal control signal is set into the standby state and column access is inhibited if the internal control signal is once set into the standby state. The reason is that the selected word line is shut down in the standby state so as to make it impossible to read out data.

According to the pseudo SRAM of the first embodiment, an asynchronous operation which can be controlled only by address transition can be realized without using a sync signal from the exterior like a general pseudo SRAM.

Further, optimum periods of time can be set in the row-related and column-related circuits by use of the ATDs 17 and 20 of two systems and mode discriminator 21, row access can be made in each cycle time and the high speed operation mode such as a static column mode of the conventional case can be coped with.

Second Embodiment

In the pseudo SRAM of the first embodiment, the asynchronous operation which can be controlled only by address transition is realized, but it is further possible to selectively set the synchronizing operation which is performed in synchronism with the /CE signal for each chip and attain upward compatibility of the conventional pseudo SRAM. One example is explained as the second embodiment.

Figure 9A:
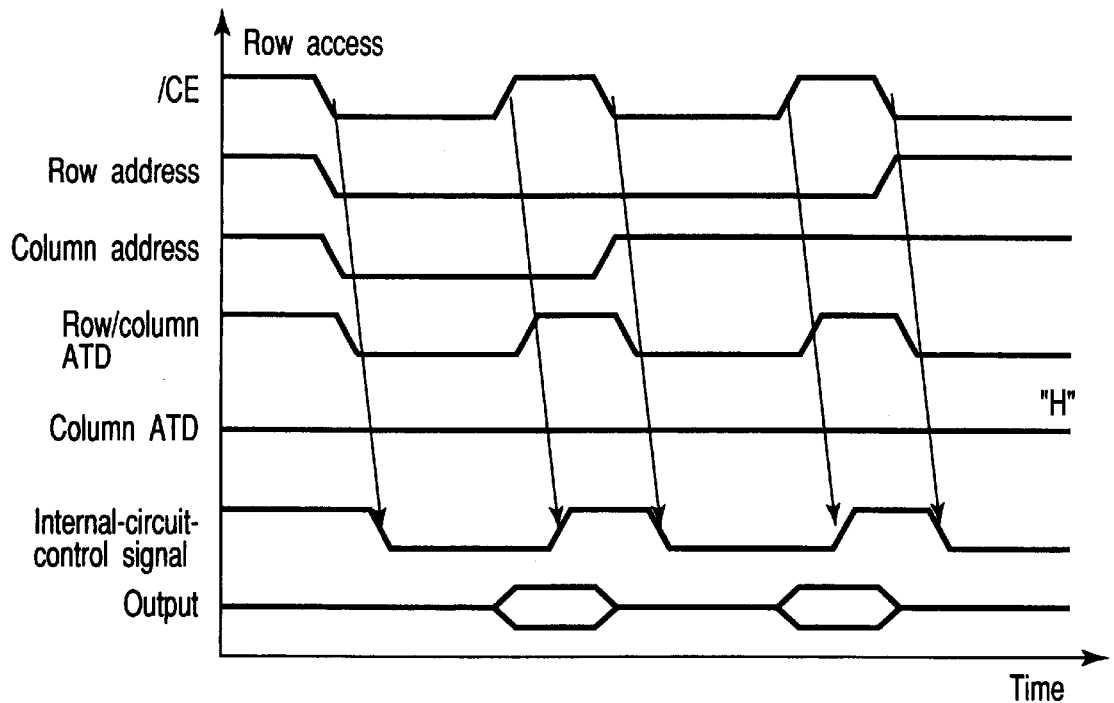
FIGS. 9A and 9B are timing diagrams for illustrating examples of the row access and column access operations of a pseudo SRAM according to a second embodiment of this invention.
Figure 9B:
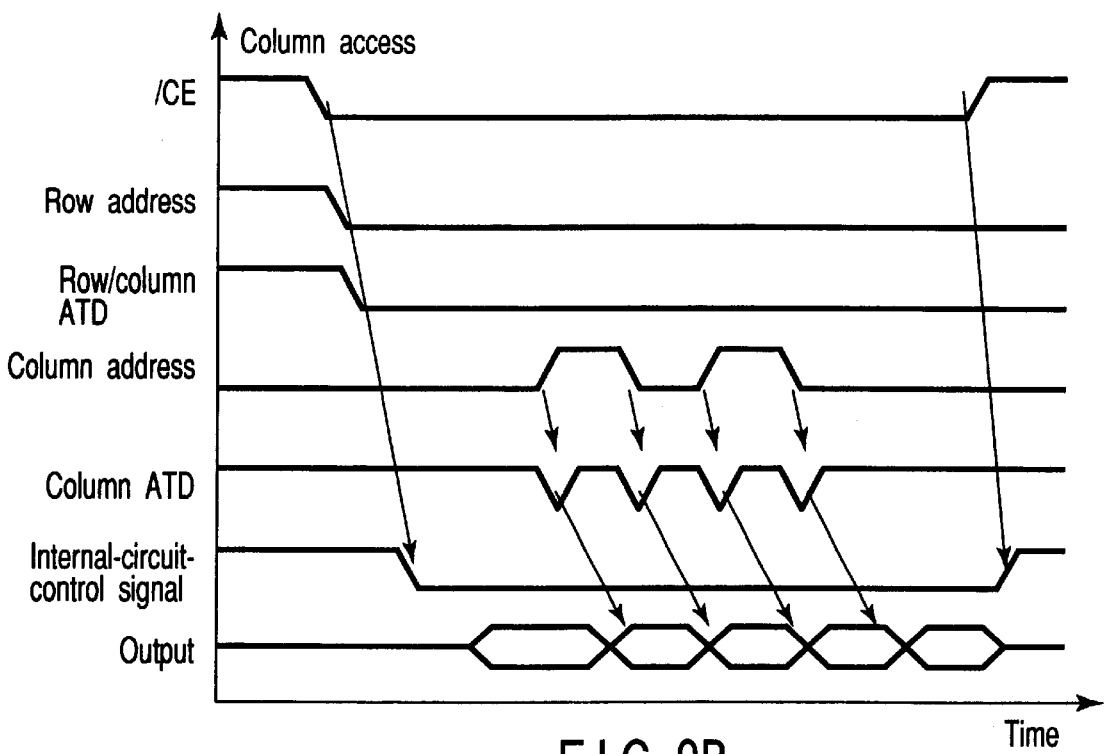

FIGS. 9A and 9B are timing diagrams for ullustrating examples of the row access and column access operations of a pseudo SRAM according to the second embodiment of this invention.

The operations shown in FIGS. 9A and 9B are similar to the examples of the row access and column access operations of the pseudo SRAM according to the first embodiment except that the operation synchronized with the /CE signal can also be performed.

In addition to the function of performing the control operation in synchronism with the address transition detection output by the mode discriminator 21 provided in the pseudo SRAM according to the first embodiment, a mode discriminator provided in the pseudo SRAM according to the second embodiment has a function of performing the control operation in synchronism with the /CE signal input and a function of selectively setting one of the above two functions for each chip. In this case, it is possible to preferentially deal with the function of performing the control operation in synchronism with the /CE signal input at any time.

Figure 10A:
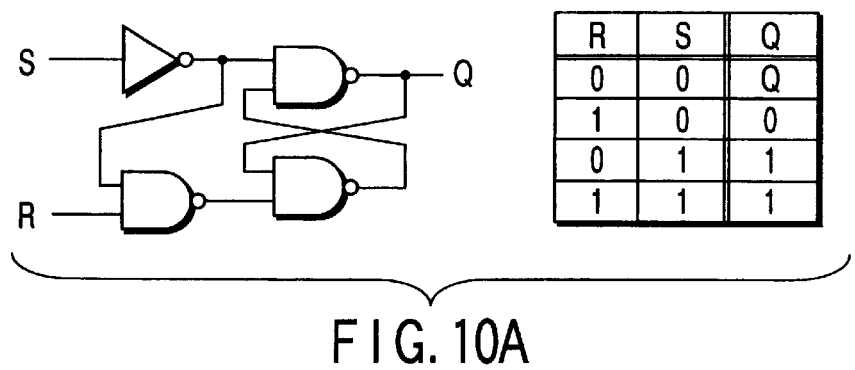
FIG. 10A is a diagram showing the configuration of a set-preference type R-S flip-flop circuit used in a mode discriminator provided in the pseudo SRAM according to the second embodiment and a truth table.

FIG. 10A shows the configuration of a set-preference type R-S flip-flop circuit in which input of a set signal S is dealt with in preference to input of a reset signal R and a truth table.

Figure 10B:
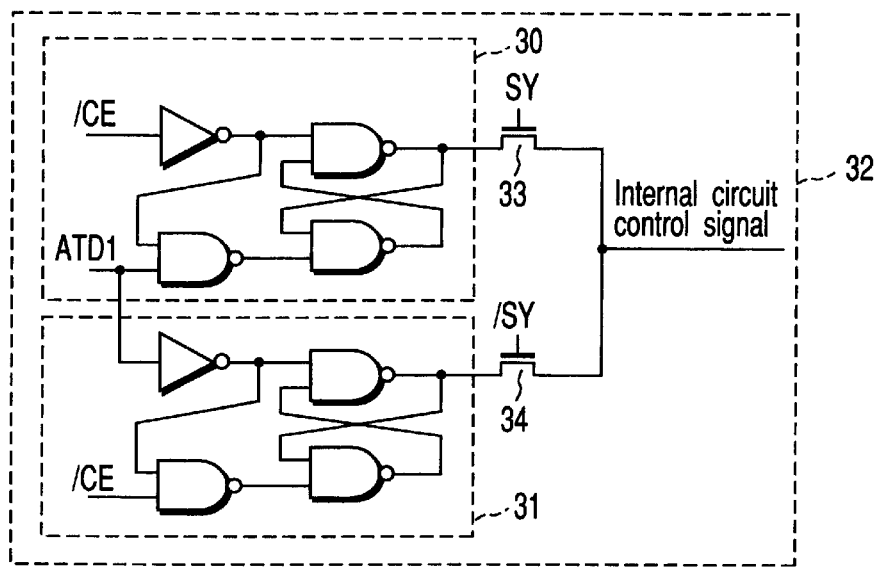
FIG. 10B is a diagram showing one example of the configuration of the mode discriminator provided in the pseudo SRAM according to the second embodiment.

FIG. 10B shows one example of the configuration of a mode discriminator provided in the pseudo SRAM according to the second embodiment and using the set-preference type R-S flip-flop circuit of FIG. 10A.

The mode discriminator includes a synchronous logic circuit 30, asynchronous logic circuit 31, and two NMOSFETs 33, 34. The two NMOSFETs 33, 34 are controlled and switched by a synchronous command signal SY and asynchronous command signal /SY to selectively switch the output of the synchronous logic circuit 30 and the output of the asynchronous logic circuit 31 and output the selected output as an internal circuit control signal.

The synchronous logic circuit 30 includes a /CE-preference type flip-flop circuit which is supplied with a /CE signal as the set signal S of the set-preference type R-S flip-flop circuit of FIG. 10A and the row-and-column-related ATD signal ATD1 shown in FIG. 5A as the reset signal R.

The asynchronous logic circuit 31 includes an ATD1-preference type flip-flop circuit which is supplied with the row-and-column-related ATD pulse signal ATD1 shown in FIG. 6A as the set signal S of the set-preference type R-S flip-flop circuit of FIG. 10A and a /CE signal as the reset signal R.

The operation of the mode discriminator shown in FIG. 10B permits an internal circuit control signal which is synchronized with the /CE signal to be generated by selecting the output of the synchronous logic circuit 30 by use of the synchronous command signal SY="H" in the case of the synchronous mode. Further, in the case of the asynchronous mode, an internal circuit control signal which is synchronized with the row-and-column-related ATD pulse signal ATD1 is generated by selecting the output of the asynchronous logic circuit 31 by use of the asynchronous command signal /SY="H".

By the above operation, as shown in FIGS. 9A and 9B, it is possible to perform the synchronizing operation in which the activating operation is started in synchronism with the fall of the /CE signal and the standby state is set in synchronism with the rise of the /CE signal.

Figure 10C:
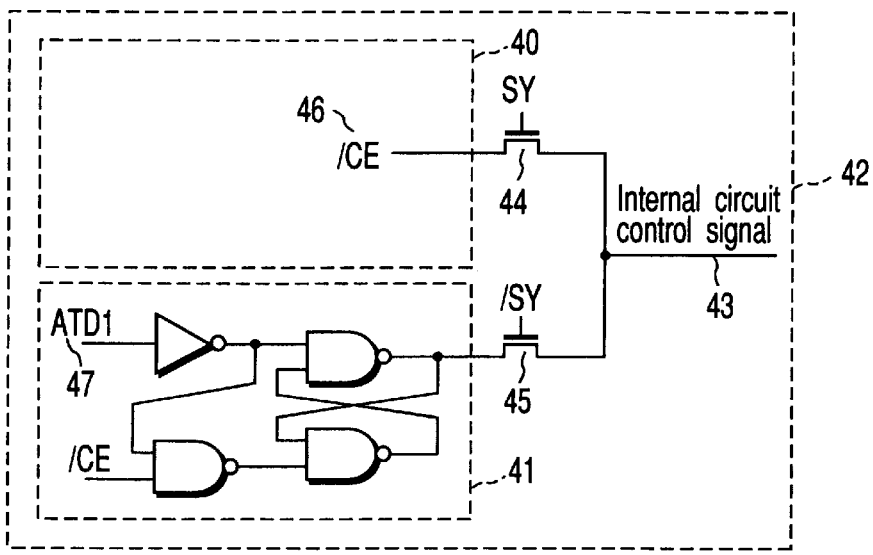
FIG. 10C is a diagram showing a modification of the mode discriminator provided in the pseudo SRAM according to the second embodiment.

FIG. 10C shows a modification of the mode discriminator shown in FIG. 10B and using the set-preference type R-S flip-flop circuit of FIG. 10A.

The mode discriminator of FIG. 10C is similar to that shown in FIG. 10B except that a synchronous logic circuit 40 which directly selects a /CE signal input by use of an NMOSFET 44 to be controlled and switched by the synchronous command signal SY is used instead of the synchronous logic circuit 30 and NMOSFET 33.

Third Embodiment

A case wherein DRAM cells each having a one-transistor•one-capacitor structure as shown in FIG. 11A, for example, are used in the memory core section in the pseudo SRAM according to the first and second embodiments is considered. In this case, as shown in FIG. 11B, a word line WL is selected in a state in which precharge voltage of a bit line BL connected to one end side of a cell capacitor and potential of a plate line PL connected to the other end side of the cell capacitor are set at half the power supply voltage VCC.

A pseudo SRAM in which FeRAM cells each of which has a one-transistor•one-capacitor structure and whose plate line potential is pulse-driven, for example, are used in the memory core section is explained in the third embodiment.

FIGS. 12A and 12B show the equivalent circuit of an FeRAM cell having a one-transistor•one-capacitor structure and the operation waveforms thereof. As an insulating film of the cell capacitor of the FeRAM cell, a ferroelectric material, for example, lead titanate zirconate (PbZrTiO$_3$: PZT) is used.

FIG. 13 shows one example of the relation (hysteresis characteristic) between a voltage applied to the cell capacitor of the FeRAM cell of FIG. 12A and remanent polarization.

First, the configuration of a known FeRAM cell and the data writing/readout/re-writing operation are simply explained with reference to FIGS. 12A and 12B and FIG. 13.

The data writing operation with respect to the FeRAM cell can be performed by pulse-driving the plate line PL from the ground potential ("L" level) to a certain potential ("H" level) while the word line WL is kept in the selected state and then returning the same to the "L" level, thereby making it possible to write data of the bit line.

The stored data readout operation with respect to the FeRAM cell can be performed by pulse-driving the plate line PL from the "L" level to the "H" level, thereby making it possible to read out charges onto the bit line BL.

That is, the cell capacitor of the FeRAM cell of FIG. 12A is set in either an upward polarization state as indicated by "0" in FIG. 13 or a downward polarization state as indicated by "1" in FIG. 13 while no voltage is applied across the cell capacitor.

When a voltage higher than a voltage on the bit line BL side is applied to the plate line PL side, the polarization is not inverted if the previous state is the polarization state "1", for example, but the polarization is inverted if the previous state is the polarization state "0".

Since the amount of charges required for applying the same voltage across the cell capacitor, that is, the amount of charges occurring on one end (bit line side) of the cell capacitor when a preset voltage is applied to the other end (plate line side) of the cell capacitor is different in the polarization states of "0" and "1", it becomes possible to read out data by detecting the difference therebetween. The above data readout operation of the FeRAM cell is the destructive readout operation and it is necessary to perform the re-writing operation without fail after the readout operation was performed.

As shown in FIG. 12B, in the data re-writing operation with respect to the FeRAM cell of FIG. 12A, the data "0" writing operation is performed when data is sensed and amplified by the sense amplifier at the readout time if readout data is "0", and the data "1" writing operation is started after the plate line PL is returned from the "H" level to the "L" level if readout data is "1".

FIGS. 14 and 15 are timing diagrams for illustrating examples of the row access operation and column access operation of the pseudo SRAM according to the third embodiment of this invention.

In the synchronous FeRAM, the internal circuit is operated based on the /CE signal and, for example, the data "1" writing operation is started after the plate line PL is returned from the "H" level to the "L" level based on the /CE signal during the standby operation in which the /CE signal is set at the "H" level. However, in the asynchronous operation, the /CE signal is always kept at the "L" level and the re-writing operation cannot be performed unless the standby state is forcedly set up in the internal section.

On the other hand, in the pseudo SRAM according to the third embodiment, as shown in FIGS. 14 and 15, the transition of the row address or column address is detected by the row-and-column-related ATD while the /CE signal is kept at the active level "L" and an internal circuit control signal is generated. Then, the potential of the word line WL connected to the FeRAM cell and the potential of the plate line PL are controlled by the above control signal.

The plate line PL is caused to rise to a preset potential after the word line WL is selected in a case where the internal circuit control signal is activated and selection of the word line WL is interrupted after the potential of the plate line PL is caused to fall in a case where the above control signal is deactivated.

In this case, the plate line PL is returned from the "H" level to the "L" level (A in FIG. 14) when a certain delay time has elapsed after, for example, a sense amplifier control signal which is activated at the end of the operation of the row-related circuit, then the data "1" writing operation is started and the word line WL is shut down (B in FIG. 14).

At this time, when the operation of, for example, the static column mode in which the high speed operation is performed in response to transition of the column address is performed, it is necessary to hold the plate line PL at the "H" level until the end of the operation. Therefore, like the pseudo SRAM according to the first embodiment, a mode discriminator which determines one of the row access and column access to be preferentially dealt with is used.

Modification of Third Embodiment

In the third embodiment, the pseudo SRAM in which the FeRAM cell array in which the FeRAM cells each having a one-transistor•one-capacitor structure are independently connected to the bit lines BL and plate lines PL is used in the memory core section is explained. In the modification of the third embodiment, it is possible to provide a pseudo SRAM in which an array having known TC parallel unit serial connection type FeRAM cells connected as one unit to the bit line BL and plate line PL is used in the memory core section.

Figure 16A:
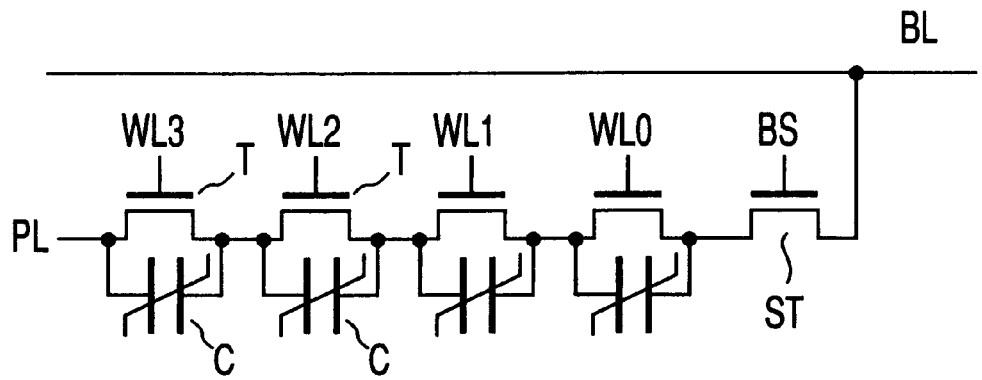
FIGS. 16A and 16B are diagrams showing the equivalent circuit of one unit of TC-parallel unit serial connection type ferroelectric memory cells used in the memory core section of a pseudo SRAM according to a modification of the third embodiment and the operation waveforms thereof.
Figure 16B:
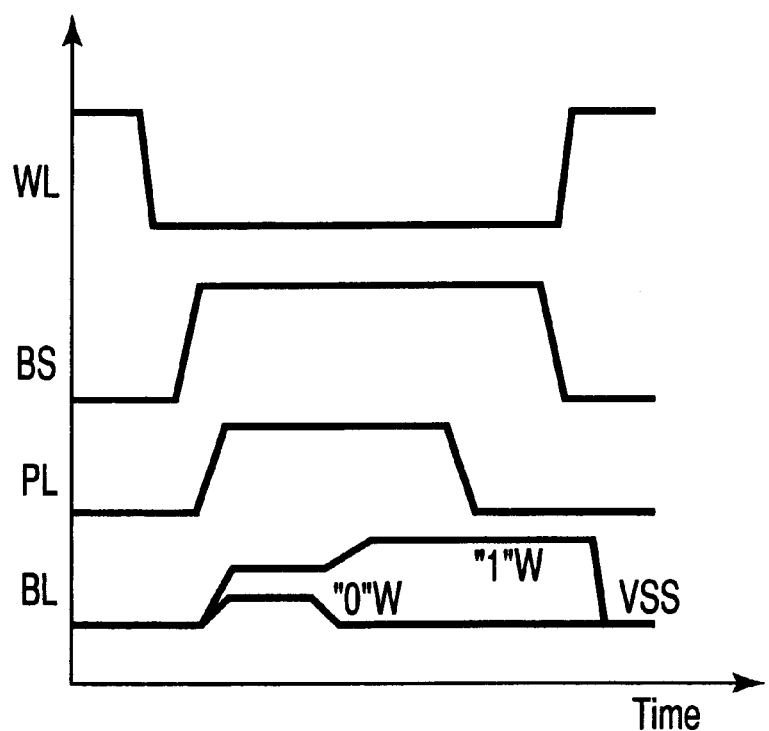

FIGS. 16A and 16B show the equivalent circuit of one unit of TC parallel unit serial connection type FeRAM cells and the operation waveforms thereof.

One unit of TC parallel unit serial connection type FeRAM cells shown in FIG. 16A is configured by serially connecting a plurality of (four in this example) FeRAM cells each having a cell transistor T and a ferroelectric cell capacitor C connected in parallel and one unit selection transistor ST. The gates of the cell transistors T of the respective FeRAM cells are respectively connected to word lines WL0 to WL3 and the gate of the unit selection transistor ST is connected to a unit selection line BS.

The word lines WL0 to WL3 other than one word line which corresponds to a selected cell are set at the "H" level and the cell transistors T corresponding to the above word lines are controlled to be set in the ON state. Only one word line corresponding to the selected cell is set at the "L" level and the cell transistor T corresponding to the above word line is controlled to be set in the OFF state. As a result, the cell capacitor C of the selected cell is connected between the plate line PL and the bit line BL via the unit selection transistor ST.

As described above, according to the semiconductor integrated circuit containing the pseudo SRAM of this invention, the asynchronous operation which cannot be coped with by the conventional technique can be performed and high speed column access can be asynchronously made.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit comprising:
   a memory cell array,
   a first address transition detecting circuit which detects transition of a row address signal used to designate a row address of said memory cell array and transition of a column address signal used to designate a column address thereof,
   a second address transition detecting circuit which detects only the transition of the column address signal,
   a control circuit which generates an internal circuit control signal with a desired period of time required for row access to said memory cell array based on only a first detection signal generated from said first address transition detecting circuit to control the row access to said memory cell array based on the internal circuit control signal and generates a column-related circuit control signal with a desired period of time required for column access to said memory cell array based on only a second detection signal generated from said second address transition detecting circuit to control the column access to said memory cell array based on the column-related circuit control signal, and
   a mode discriminator which determines one of the row access and the column access to be made and performs an access control operation based on a determination result.

2. The semiconductor integrated circuit according to claim 1, wherein the internal circuit control signal generated based on the first detection signal from said first address transition detecting circuit has a longer period than the column-related circuit control signal generated based on the second detection signal from said second address transition detecting circuit.

3. The semiconductor integrated circuit according to claim 1, wherein each of said first and said second address transition detecting circuit includes a transition detecting section which detects transition of an address signal corresponding to one of the row address signal and the column address signal, and a delay circuit section which delays an output signal of said transition detecting section by desired time and a logical AND of the output signal of said transition detecting section and the output signal of said delay section is output.

4. The semiconductor integrated circuit according to claim 1, wherein only said first address transition detecting circuit is activated when the row access is made and only said second address transition detecting circuit is activated when the column access is made.

5. The semiconductor integrated circuit according to claim 1, wherein said mode discriminator includes a reference time generating circuit which generates a reference time, is supplied with the first detection signal from said first address transition detecting circuit and the second detection signal from said second address transition detecting circuit, and compares an input interval of a third detection signal corresponding to an interval between address transitions with the reference time to determine one of a row access mode and a column access mode.

6. The semiconductor integrated circuit according to claim 5, wherein the third detection signal is obtained based on NOR logic of the first detection signal from said first address transition detecting circuit and the second detection signal from said second address transition detecting circuit.

7. The semiconductor integrated circuit according to claim 5, wherein said mode discriminator sets the internal circuit control signal in an active state for a preset cycle time when the row access mode is determined.

8. The semiconductor integrated circuit according to claim 5, wherein said mode discriminator sets the internal circuit control signal in an active state until an end of access when the column access mode is determined, determines the end of access when an interval between the address transitions becomes longer than a preset time and performs a control operation to be set into a standby state.

9. The semiconductor integrated circuit according to claim 1, wherein said mode discriminator includes a time comparing circuit, is supplied with the first detection signal from said first address transition detecting circuit and the second detection signal from said second address transition detecting circuit, and compares an input interval of a third detection signal corresponding to an interval between address transitions with the first detection signal to determine one of a row access mode and a column access mode.

10. The semiconductor integrated circuit according to claim 9, wherein the third detection signal is obtained based on NOR logic of the first detection signal from said first address transition detecting circuit and the second detection signal from said second address transition detecting circuit.

11. The semiconductor integrated circuit according to claim 9, wherein said mode discriminator sets the internal circuit control signal in an active state for a preset cycle time when the row access mode is determined.

12. The semiconductor integrated circuit according to claim 9, wherein said mode discriminator sets the internal circuit control signal in an active state until an end of access when the column access mode is determined, determines the end of access when an interval between the address transitions becomes longer than preset time and performs a control operation to be set into a standby state.

13. The semiconductor integrated circuit according to claim 1, wherein said mode discriminator includes a reference time generating circuit and a counter which counts pulses, is supplied with the first detection signal from said first address transition detecting circuit and the second detection signal from said second address transition detecting circuit, and determines a column access mode when the number of pulses of a third detection signal corresponding to an interval between the address transitions within the reference time is not less than "2".

14. The semiconductor integrated circuit according to claim 1, wherein said mode discriminator includes a detecting section which detects a mode command input from an exterior and makes mode determination based on the mode command input to specify one of the row access and the column access before an operation of the semiconductor integrated circuit or during the operation thereof.

15. The semiconductor integrated circuit according to claim 1, wherein said mode discriminator preferentially detects a chip enable signal input from an exterior and performs a control operation to synchronize the internal circuit control signal with a chip enable signal.

16. The semiconductor integrated circuit according to claim 1, wherein dynamic memory cells are used in said memory cell array.

17. The semiconductor integrated circuit according to claim 1, wherein ferroelectric memory cells are used in said memory cell array.

18. The semiconductor integrated circuit according to claim 17, wherein the ferroelectric memory cell is connected to a word line and a plate line and potentials of the word line and the plate line are controlled according to the internal circuit control signal.

19. The semiconductor integrated circuit according to claim 1, wherein transistor•capacitor-parallel unit serial connection type ferroelectric memory cells are used in said memory cell array.

20. The semiconductor integrated circuit according to claim 19, wherein the ferroelectric memory cell is connected to a word line and a plate line and potentials of the word line and the plate line are controlled according to an internal circuit control signal generated based on a detection output by said first address transition detecting circuit.

* * * * *